(12) United States Patent
Kunita (10) Patent No.: US 11,257,703 B2
(45) Date of Patent: Feb. 22, 2022

(54) SEMICONDUCTOR MANUFACTURING APPARATUS

(71) Applicant: NGK INSULATORS, LTD., Nagoya (JP)

(72) Inventor: Shinpei Kunita, Santa Clara, CA (US)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 17/022,396

(22) Filed: Sep. 16, 2020

(65) Prior Publication Data

US 2020/0411357 A1    Dec. 31, 2020

Related U.S. Application Data

(63) Continuation of application No. PCT/JP2019/009028, filed on Mar. 7, 2019.

(30) Foreign Application Priority Data

Mar. 23, 2018  (JP) .............................. JP2018-055519

(51) Int. Cl.
*H01L 21/683*     (2006.01)
*H02N 13/00*      (2006.01)
(Continued)

(52) U.S. Cl.
CPC ........ *H01L 21/6833* (2013.01); *H01L 21/683* (2013.01); *H02N 13/00* (2013.01);
(Continued)

(58) Field of Classification Search
CPC ..... H01L 21/683; H01L 21/67; H01L 21/687; H01L 21/68785; H02J 37/32; H02N 13/00
(Continued)

(56) References Cited

U.S. PATENT DOCUMENTS 6,151,203 A * 11/2000 Shamouilian .......... H02N 13/00
                                                                361/234
2018/0020544 A1* 1/2018 Takebayashi ....... H01L 21/6833

FOREIGN PATENT DOCUMENTS

JP      2008-098513 A1   4/2008
JP         3181603 U     2/2013
(Continued)

OTHER PUBLICATIONS

International Search Report and Written Opinion (Application No. PCT/JP2019/009028) dated Jun. 4, 2019.
(Continued)

*Primary Examiner* — Danny Nguyen
(74) *Attorney, Agent, or Firm* — Burr & Brown, PLLC (57) ABSTRACT

A semiconductor manufacturing apparatus includes: a metal base member fixed to a surface, on the opposite side of a wafer mounting surface, of an electrostatic chuck; an electrode terminal connected to an electrode embedded in the electrostatic chuck; a through hole provided at a position of the base member, the position being opposed to the electrode terminal; an insulating sleeve fixed to the inner circumferential surface of the through hole; a chuck-side terminal which is connected to the electrode terminal via a flexible cable, and fixed to the insulating sleeve with arranged in the insulating sleeve; a flexible insulating tube that covers the cable, the flexible insulating tube having one end fixed to the electrode terminal and the other end fixed to the chuck-side terminal; and an insulating resin member that covers at least part of the electrode terminal, the part being not covered by the insulating tube.

7 Claims, 7 Drawing Sheets

(51) Int. Cl.
    *H01L 21/687*     (2006.01)
    *H01L 21/67*     (2006.01)

(52) U.S. Cl.
    CPC ............ *H01L 21/67* (2013.01); *H01L 21/687* (2013.01); *H01L 21/68785* (2013.01)

(58) Field of Classification Search
    USPC ........................................................ 361/234
    See application file for complete search history.

(56) References Cited

FOREIGN PATENT DOCUMENTS

| | | |
|---|---|---|
| JP | 2013-191626 A1 | 9/2013 |
| JP | 2015-207765 A1 | 11/2015 |
| JP | 2015-228398 A1 | 12/2015 |
| JP | 2016-143795 A1 | 8/2016 |

OTHER PUBLICATIONS

English translation of the International Preliminary Report on Patentability (Chapter I) (Application No. PCT/JP2019/009028) dated Oct. 8, 2020.

\* cited by examiner

SEMICONDUCTOR MANUFACTURING APPARATUS

BACKGROUND OF THE INVENTION

1. Field of the Invention

The present invention relates to a semiconductor manufacturing apparatus.

2. Description of the Related Art

Figure 7:
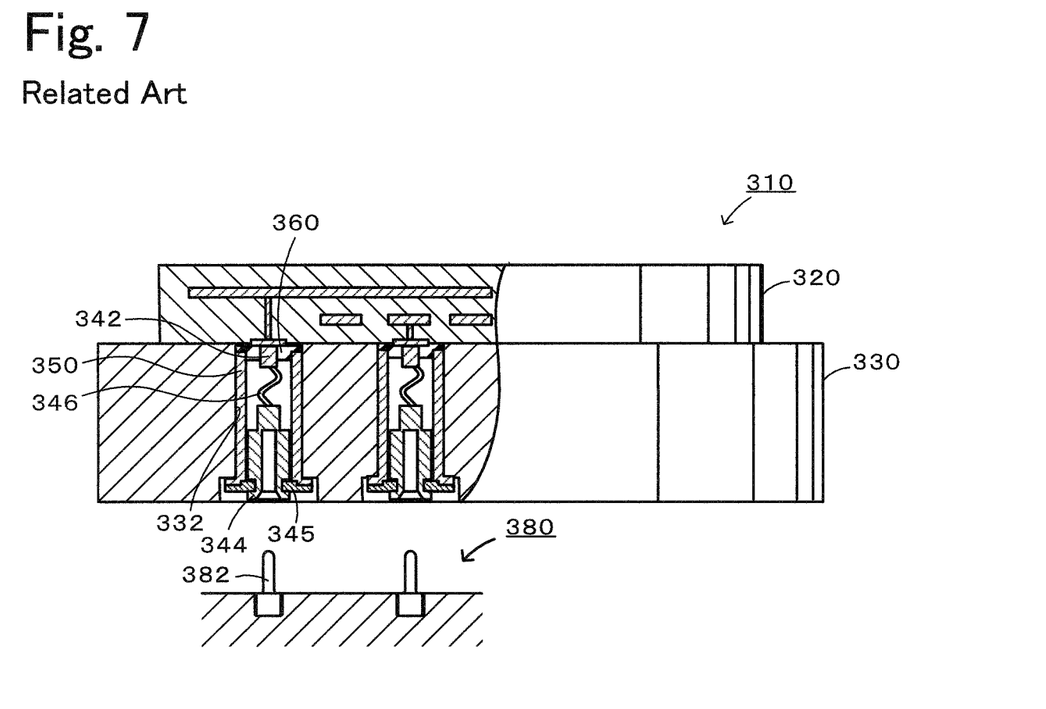
FIG. 7 is a partial cross-sectional view illustrating the schematic outline of a semiconductor manufacturing apparatus 310.

A semiconductor manufacturing apparatus is used to fix a wafer and heat or cool a wafer in an etching apparatus, an ion injection apparatus, an electron beam exposure apparatus and the like. As such a semiconductor manufacturing apparatus, one is known which includes a ceramic electrostatic chuck which has a wafer and in which an electrostatic electrode is built; and a metal base member bonded to the surface, on the opposite side of a wafer mounting surface, of the electrostatic chuck. FIG. 7 illustrates a partial cross-sectional view of a semiconductor manufacturing apparatus 310 disclosed by PTL 1. The semiconductor manufacturing apparatus 310 includes an electrostatic chuck 320 having an electrode terminal 342 on its rear surface; and a metal base member 330 fixed to the rear surface of the electrostatic chuck 320. The base member 330 has a through hole 332 at a position opposed to the electrode terminal 342. An insulating sleeve 350 is fixed to the through hole 332. A chuck side terminal 344 detachably connected to a terminal 382 of another apparatus 380 is fixed the insulating sleeve 350 via C-shaped fixing ring 345. The chuck side terminal 344 is connected to the electrode terminal 342 via a flexible cable 346. The leading end of the insulating sleeve 350 is embedded in an insulating resin member 360 around the electrode terminal 342.

CITATION LIST

Patent Literature

PTL 1: JP No. 3181603 U

SUMMARY OF THE INVENTION

In recent years, use of higher power is increasingly common in various processes, and a withstand voltage required across the metal base member 330 and the electrode terminal 342 and across the metal base member 330 and the cable 346 is increasing and higher than a conventional withstand voltage. Meanwhile, in the semiconductor manufacturing apparatus 310, the leading end of the insulating sleeve 350 sometimes does not reach the insulating resin member 360. In that case, the withstand voltage across the metal base member 330 and the electrode terminal 342 and across the metal base member 330 and the cable 346 does not achieve a required value, and an insulation breakdown may occur.

The present invention has been devised to solve such a problem, and it is a primary object to sufficiently increase the withstand voltage across the metal base member and the electrode terminal and across the metal base member and the cable.

A semiconductor manufacturing apparatus of the present invention includes:

a ceramic substrate which has a wafer mounting surface, and in which an electrode is built;

a metal base member fixed to a surface, on an opposite side of the wafer mounting surface, of the ceramic substrate;

an electrode terminal provided in the surface, on the opposite side of the wafer mounting surface, of the ceramic substrate and connected to the electrode;

a through hole provided at a position of the base member, the position being opposed to the electrode terminal;

an insulating sleeve fixed to an inner circumferential surface of the through hole;

a semiconductor manufacturing apparatus-side terminal which is connected to the electrode terminal via a flexible cable, fixed to the insulating sleeve with arranged in the insulating sleeve, and detachably connected to a terminal of another apparatus;

a flexible insulating tube that covers the cable, the flexible insulating tube having one end fixed to the electrode terminal and the other end fixed to the semiconductor manufacturing apparatus-side terminal; and an insulating resin member that covers at least part of the electrode terminal, the part being not covered by the insulating tube.

The semiconductor manufacturing apparatus includes an insulating tube. The insulating tube has one end fixed to the electrode terminal and the other end fixed to the semiconductor manufacturing apparatus-side terminal, and covers the cable. In addition, at least part of the electrode terminal, not covered by the insulating tube, is covered by the insulating resin member. In other words, the electrode terminal is covered by the insulating tube and the insulating resin member, and the cable is covered by the insulating tube. Thus, it is possible to sufficiently increase the withstand voltage across the base member and the electrode terminal and across the base member and the cable.

In the semiconductor manufacturing apparatus of the present invention, the inner diameter of the insulating tube may be greater than the outer diameter of the cable. In this manner, the insulating tube and the cable can deflect independently without interfering with each other. Thus, it is possible to reduce the pressure from the insulating tube and the cable to the electrode terminal.

In the semiconductor manufacturing apparatus of the present invention, the insulating tube may have a deflection and bulge shape at its central portion which covers the cable. In this manner, the insulating tube and the cable are not in contact with each other, thus it is possible to prevent the insulating tube from being broken by the cable.

In the semiconductor manufacturing apparatus of the present invention, the leading end of the insulating sleeve may not reach the insulating resin member. Since the semiconductor manufacturing apparatus of the present invention includes the insulating tube described above, even when the leading end of the insulating sleeve does not reach the insulating resin member which covers the electrode terminal, it is possible to sufficiently increase the withstand voltage across the base member and the electrode terminal and across the base member and the cable.

In the semiconductor manufacturing apparatus of the present invention, the insulating tube may be a heat shrinking tube. The heat shrinking tube has flexibility, and when heated, shrinks and has a reduced diameter, thus is easily fixed to each terminal. Thus, the heat shrinking tube is suitable to be used as an insulating tube.

In the semiconductor manufacturing apparatus of the present invention, the insulating tube may be formed of a material which is expandable and contractible in an axial direction of the through hole or may be formed in a structure which is expandable and contractible in the axial direction of the through hole. The material expandable and contractible in the axial direction of the through hole includes, for instance, vinyl chloride, chloride rubber, and fluoropolymer. These are also used as the material of the heat shrinking tube. The structure expandable and contractible in the axial direction of the through hole includes, for instance, bellows (snake belly).

In the semiconductor manufacturing apparatus of the present invention, the cable may be a twisted wire made of metal. When a force is applied in a shrinking direction, the twisted wire made of metal has a bulge shape, resulting in a shorter entire length.

DETAILED DESCRIPTION OF THE INVENTION

Figure 1:
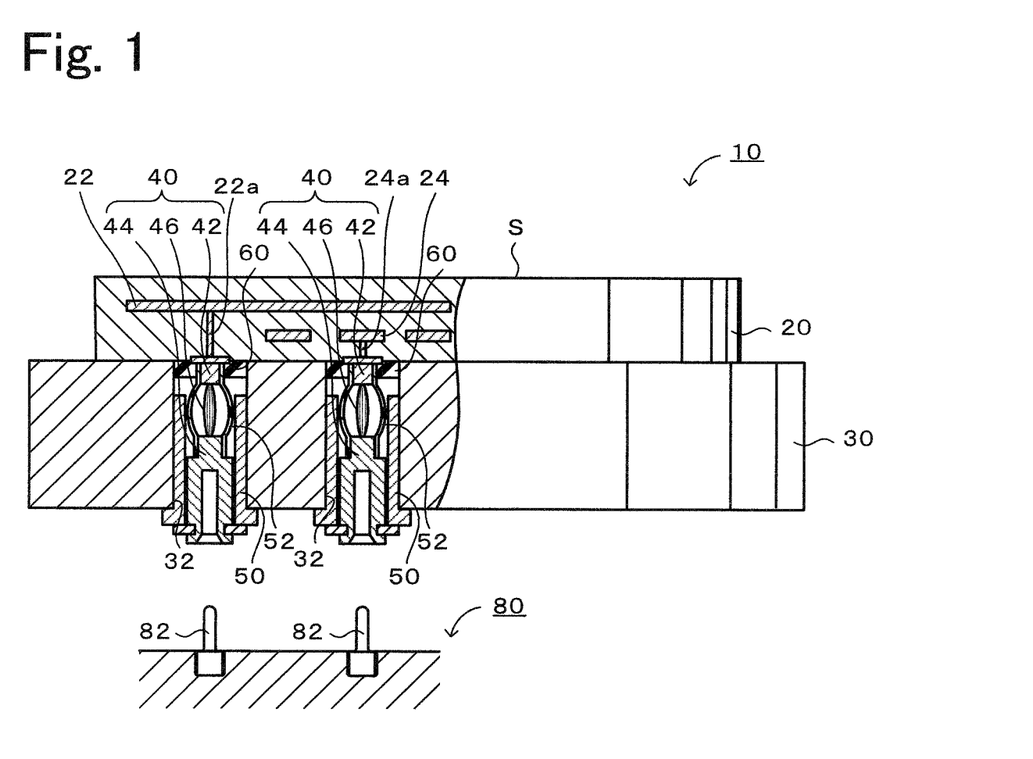
FIG. 1 is a partial cross-sectional view illustrating the schematic outline of a semiconductor manufacturing apparatus 10.
Figure 2:
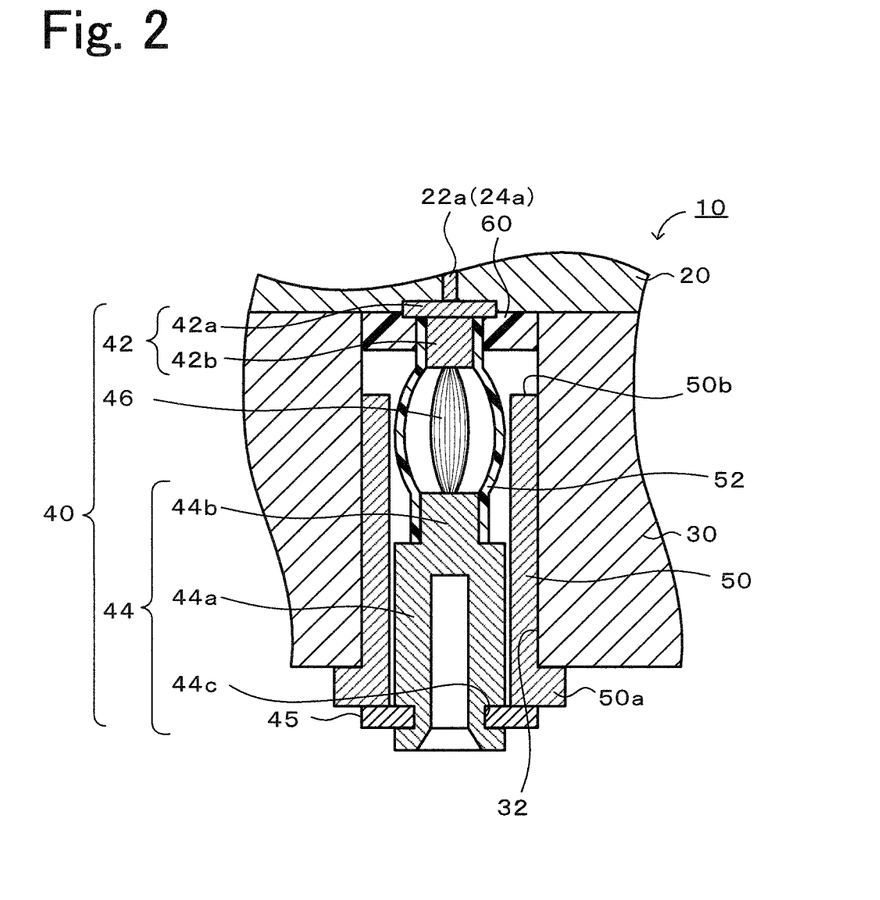
FIG. 2 is an enlarged cross-sectional view of a terminal assembly 40 and its vicinity of the semiconductor manufacturing apparatus 10.

A preferred embodiment of the present invention will be described below with reference to the drawings. FIG. 1 is a partial cross-sectional view illustrating the schematic outline of a semiconductor manufacturing apparatus 10. FIG. 2 is an enlarged cross-sectional view of a terminal assembly 40 and its vicinity of the semiconductor manufacturing apparatus 10.

As illustrated in FIG. 1, the semiconductor manufacturing apparatus 10 includes an electrostatic chuck 20, a base member 30, a terminal assembly 40, an insulating sleeve 50, an insulating tube 52, and an insulating resin member 60.

The electrostatic chuck 20 is a disc-shaped ceramic sintered body (for instance, alumina ceramic sintered body) having a surface of a wafer mounting surface S. The electrostatic chuck 20 internally has an electrostatic electrode 22 that attracts a wafer mounted on the wafer mounting surface S, by an electrostatic force; and a heater electrode 24 that generates heat when a voltage is applied thereto. Multiple electrode terminals 42 are provided on the rear surface of the electrostatic chuck 20. Some of the electrode terminals 42 are connected to the electrostatic electrode 22 via a wire 22a, and the other of the electrode terminals 42 are connected to the heater electrode 24 via a wire 24a. The electrostatic chuck 20 corresponds to the ceramic substrate of the present invention.

The base member 30 is a disc-shaped member made of metal (for instance, aluminum or aluminum alloy). The base member 30 is bonded to the surface (rear surface), on the opposite side of the wafer mounting surface S, of the electrostatic chuck 20 by an adhesive agent. The base member 30 has a through hole 32 at a position opposed to each of the electrode terminals 42. The base member 30 has a function of cooling the electrostatic chuck 20, and a coolant path (not illustrated) is formed internally of the base member 30.

The terminal assembly 40 is provided internally of the insulating sleeve 50 which is inserted in each through hole 32 of the base member 30. Each terminal assembly 40 is such that a chuck side terminal 44 is connected to an electrode terminal 42 via a flexible cable 46. The electrode terminal 42 is made of metal (for instance, molybdenum), and has a disc portion 42a and a cylindrical projection 42b as illustrated in FIG. 2. The disc portion 42a is brazed to a concave hole provided in a ceramic sintered body of the electrostatic chuck 20, and joined to the wire 22a connected to the electrostatic electrode 22 or the wire 24a connected to the heater electrode 24. The projection 42b is inserted in one end of the insulating tube 52 and fixed thereto. The chuck side terminal 44 is a terminal made of metal (for instance, copper), and includes a pin jack portion 44a, a projection 44b, and a recessed groove 44c as illustrated in FIG. 2. The pin jack portion 44a is a female-type connector which is a cylindrical body provided with a bottomed hole. The projection 44b is a cylindrical projection provided on the side, opposed to the electrode terminal 42, of the pin jack portion 44a, and is inserted in the other end of the insulating tube 52 and fixed thereto. The recessed groove 44c is provided on the entire circumference at a position, near an opening, of the outer circumferential surface of the pin jack portion 44a. A C-shaped fixing ring 45 is fitted into the recessed groove 44c. The fixing ring 45 is formed of a material having an electrical insulating property, such as a ceramic material and a resin material. The cable 46 is a twisted wire made of metal (for instance, copper), and is formed by twisting a great number of fine wires. Thus, when a force is applied to the cable 46 in a contraction direction, its central portion bulges and the entire length is reduced. The cable 46 is arranged in the space between the electrode terminal 42 and the chuck side terminal 44 with a force applied in a contraction direction. It is to be noted that the chuck side terminal 44 corresponds to the semiconductor manufacturing apparatus-side terminal of the present invention.

The insulating sleeve 50 is inserted in the through hole 32 of the base member 30. The outer circumferential surface of the insulating sleeve 50 is bonded to the inner circumferential surface of the through hole 32 by an adhesive agent. As illustrated in FIG. 2, the insulating sleeve 50 has a flange 50a which retains at the opening edge of the through hole 32. A leading end 50b of the insulating sleeve 50 does not reach the insulating resin member 60. The insulating sleeve 50 like this is formed of a material having an electrical insulating property, such as a ceramic material and a resin material, for instance. The fixing ring 45 fitted into the recessed groove 44c of the chuck side terminal 44 is bonded to the opening edge of the insulating sleeve 50 by an adhesive agent.

The insulating tube 52 is a heat shrinking tube, which is compressed in the axial direction, and has a shape (barrel shape) bulging at the center and its vicinity. The material of the heat shrinking tube is not particularly limited, and is, for instance, vinyl chloride, chloride rubber, and fluoropolymer. As illustrated in FIG. 2, the projection 42b of the electrode terminal 42 is inserted in one end of the insulating tube 52, and the projection 44b of the chuck side terminal 44 is inserted in the other end of the insulating tube 52. In the insulating tube 52, one end thereof is fixed to the lateral surface of the projection 42b of the electrode terminal 42, the other end is fixed to the lateral surface of the projection 44b of the chuck side terminal 44, and a central portion covers the cable 46.

The insulating resin member 60 is formed of, for instance, a silicone resin, and covers the bottom surface of the through hole, and the portion, not covered by the insulating tube 52, of the electrode terminal 42. In the present embodiment, the insulating resin member 60 also covers the outer circumferential surface of the insulating tube 52 which covers the lateral surface of the projection 42b of the electrode terminal 42.

Next, a manufacturing example of the semiconductor manufacturing apparatus 10 will be described. FIGS. 3A to 3F are assembly process views of the semiconductor manufacturing apparatus 10.

Figure 3A:
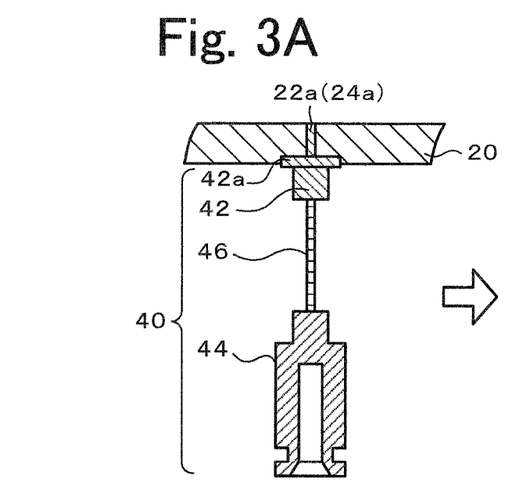
FIGS. 3A to 3F are assembly process views of the semiconductor manufacturing apparatus 10.

First, the electrostatic chuck 20 illustrated in FIG. 3A is prepared. The terminal assembly 40 is mounted on the rear surface of the electrostatic chuck 20. The terminal assembly 40 is such that the chuck side terminal 44 is assembled in the electrode terminal 42 via the flexible cable 46. The disc portion 42a of the electrode terminal 42 of the terminal assembly 40 is brazed to the wire 22a (or the wire 24a) so as to be electrically connected thereto.

Figure 3B:
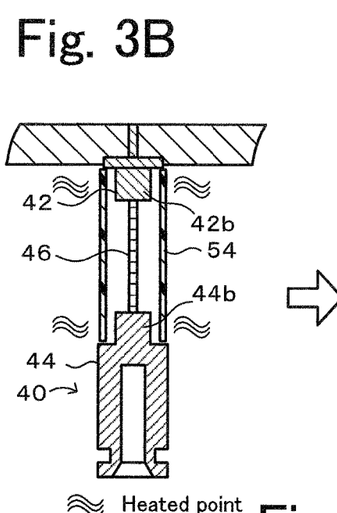

Subsequently, as illustrated in FIG. 3B, the heat shrinking tube 54 expandable and contractible in the axial direction as well as the radial direction is covered on the cable 46 of the terminal assembly 40. The heat shrinking tube 54 used here is such that the inner diameter is substantially equal to the outer diameter of the chuck side terminal 44, and the heat shrinkage rate is the same over the entire length. The heat shrinking tube 54 is arranged so that one end thereof covers the projection 42b of the electrode terminal 42, the other end covers the projection 44b of the chuck side terminal 44, and the central portion covers the cable 46. In this state, one end covering the projection 42b of the electrode terminal 42 of the heat shrinking tube 54 and the other end covering the projection 44b of the chuck side terminal 44 are heated using a heat gun which is not illustrated.

Figure 3C:
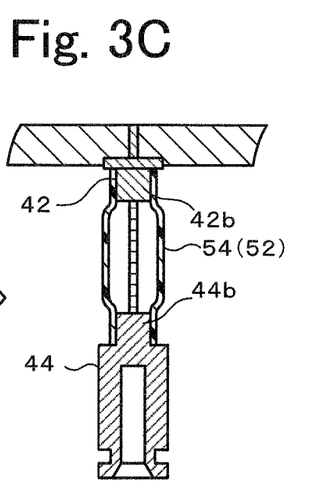

Then, as illustrated in FIG. 3C, the one end covering the projection 42b of the electrode terminal 42 of the heat shrinking tube 54 and the other end covering the projection 44b of the chuck side terminal 44 are contracted by heat, and closely fixed to the projections 42b, 44b. The heat shrinking tube 54 after heat processing is the insulating tube 52. Whether or not both ends of the insulating tube 52 are closely fixed to the projections 42b, 44b, whether or not the insulating tube 52 is broken, and whether or not the insulating tube 52 is easily contracted when a force in a contraction direction is applied thereto can be easily checked in this stage by inspecting the outer appearance and the contraction property of the insulating tube 52 by a worker.

Figure 3D:
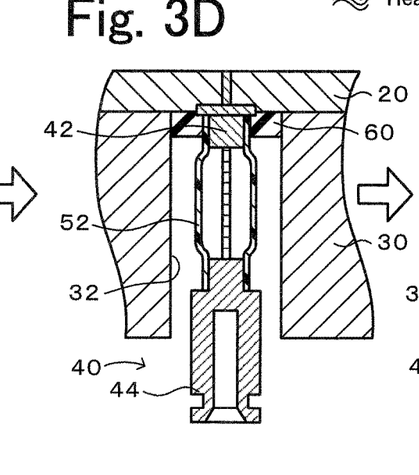

Next, as illustrated in FIG. 3D, the base member 30 is bonded to the rear surface of the electrostatic chuck 20, and subsequently, the insulating resin member 60 is formed. Specifically, first, an adhesive sheet which is not illustrated is bonded to the surface, opposed to the electrostatic chuck 20, of the base member 30 provided with the through hole 32, and the electrostatic chuck 20 and the base member 30 are bonded in a state where the terminal assembly 40 with the insulating tube 52 attached is inserted in the through hole 32. Subsequently, an insulating resin material is injected to the bottom surface of the through hole 32 so as to cover the exposed surface of the electrode terminal 42, and is solidified, thereby forming the insulating resin member 60. At this time, the chuck side terminal 44 of the terminal assembly 40 is exposed to the outside through the through hole 32.

Figure 3E:
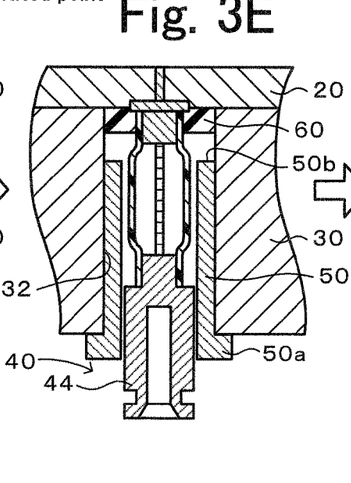

Subsequently, as illustrated in FIG. 3E, the insulating sleeve 50 is inserted in the through hole 32. Specifically, after an adhesive agent is applied to the outer circumferential surface of the insulating sleeve 50, the insulating sleeve 50 is inserted until the flange 50a retains at the opening edge of the through hole 32. At this time, the leading end 50b of the insulating sleeve 50 has not reached the insulating resin member 60. Thus, the electrostatic chuck 20 does not receive a force in a direction away from the base member 30 by the insulating sleeve 50. At this time, the chuck side terminal 44 of the terminal assembly 40 is exposed to the outside through the insulating sleeve 50.

Figure 3F:
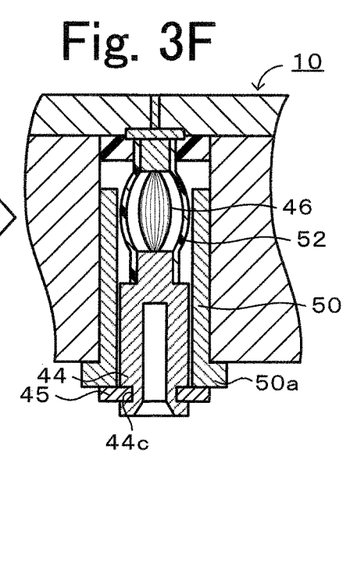

Subsequently, as illustrated in FIG. 3F, the fixing ring 45 is fitted into the recessed groove 44c of the chuck side terminal 44, the chuck side terminal 44 is pushed to the back of the insulating sleeve 50, and the fixing ring 45 and the flange 50a of the insulating sleeve 50 are bonded by an adhesive agent. At this time, the inner diameter of the insulating tube 52 is greater than the outer diameter of the cable 46. Thus, the insulating tube 52 and the cable 46 can deflect independently without interfering with each other. Since the insulating tube 52 is a heat shrinking tube, when a force in a contraction direction is applied thereto, the central portion covering the cable 46 has a deflection and bulge shape (barrel shape). Thus, the insulating tube 52 and the cable 46 do not come into contact with each other, and the insulating tube 52 can be prevented from being broken by the cable 46. Also, since the cable 46 is a twisted wire formed by twisting a great number of fine metal wires, when a force in a contraction direction is applied thereto, the fine metal wires deflect and have a bulge shape near the center. In this manner, the semiconductor manufacturing apparatus 10 can be manufactured.

Next, an example of use of the semiconductor manufacturing apparatus 10 will be described. The semiconductor manufacturing apparatus 10 is used by connecting to a processing apparatus 80 (see FIG. 1, corresponding to another apparatus of the present invention) according to a purpose of processing of a wafer. The processing apparatus 80 is provided with a processing apparatus-side terminal 82 (male-type connector) at a position opposed to each chuck side terminal 44 (female-type connector) of the semiconductor manufacturing apparatus 10. When the semiconductor manufacturing apparatus 10 is connected to the processing apparatus 80, terminals facing each other are connected in a state where the base member 30 is fixed to a support base which is not illustrated. Subsequently, a wafer is mounted on the wafer mounting surface S, and a voltage is applied to the electrostatic electrode 22 to cause the wafer mounting surface S to attract the wafer. A high-frequency voltage is applied across the base member 30 and a shower head, which is not illustrated, provided at a position opposed to the wafer mounting surface S of the semiconductor manufacturing apparatus 10, and thus plasma is generated, and the wafer on the wafer mounting surface S is processed. At this time, control is performed so that the temperature of the wafer becomes a predetermined temperature. For instance, when the temperature of the wafer is too low, the wafer is heated by applying a voltage to the heater electrode 24 and generating heat in the heater electrode 24. On the other hand, when the temperature of the wafer is too high, the wafer is cooled by the base member 30 without applying a voltage to the heater electrode 24.

When the wafer is processed in this manner, a high power high-frequency voltage may be applied across a shower head which is not illustrated and the base member 30. Here, the semiconductor manufacturing apparatus 10 includes the insulating tube 52. In the insulating tube 52, one end thereof is fixed to the projection 42b of the electrode terminal 42 and the other end is fixed to the projection 44b of the chuck side terminal 44. Also, the portion, not covered by the insulating tube 52, of the electrode terminal 42 is covered by the insulating resin member 60. In other words, the electrode terminal 42 is covered by the insulating tube 52 and the insulating resin member 60, and the cable 46 is covered by the insulating tube 52. Thus, it is possible to sufficiently increase the withstand voltage across the base member 30 and the electrode terminal 42 and across the base member 30 and the cable 46.

With the semiconductor manufacturing apparatus 10 described in detail above, even when a high power high-frequency voltage is applied across a shower head which is not illustrated and the base member 30, it is possible to prevent insulation breakdown across the base member 30 and the electrode terminal 42 and across the base member 30 and the cable 46. Specifically, the electrode terminal 42 is covered by the insulating tube 52 and the insulating resin member 60, and the cable 46 is covered by the insulating tube 52. Thus, even when the leading end 50b of the insulating sleeve 50 does not reach the insulating resin member 60 which covers the electrode terminal 42, it is possible to sufficiently increase the withstand voltage across the base member 30 and the electrode terminal 42 and across the base member 30 and the cable 46.

Since the inner diameter of the insulating tube 52 is greater than the outer diameter of the cable 46, the insulating tube 52 and the cable 46 can deflect independently without interfering with each other. Thus, it is possible to reduce the pressure from the insulating tube 52 and the cable 46 to the electrode terminal 42.

Also, since the insulating tube 52 has a deflection and bulge shape at its central portion which covers the cable 46, the insulating tube 52 and the cable 46 do not come into contact with each other. Thus, it is possible to prevent the insulating tube 52 from being broken by the cable 46.

Also, the heat shrinking tube 54 used as the insulating tube 52 has flexibility, and is contracted and reduced in diameter when heated, thus is easily fixed to the projections 42b, 44b of the terminals 42, 44. Therefore, the heat shrinking tube 54 is suitable to be used as the insulating tube 52.

In addition, since the heat shrinking tube 54 is used as the insulating tube 52 and a metal twisted wire is used as the cable 46, in either case, when a force in a contraction direction is applied, a bulge shape is formed and the entire length is reduced. Thus, when the chuck side terminal 44 is pushed to the back of the insulating sleeve 50 as illustrated from FIG. 3E to FIG. 3F, the chuck side terminal 44 can be pushed with a relatively small resistance.

It is to be noted that the present invention is not limited to the above-described embodiment at all, and needless to say, may be implemented in various forms as long as each form belongs to the technical scope of the present invention.

For instance, although a twisted wire formed by twisting a great number of fine metal wires is used as the cable 46 in the above-described embodiment, a metal wire in a coil shape or a zigzag shape may be used. Since a metal wire in a coil shape or a zigzag shape is expandable and contractible in the axial direction, when receiving a force in a contraction direction, a coil portion or a zigzag portion is contracted and the entire length is reduced. Therefore, these wires can be used as a substitution for the above-described cable 46.

In the above-described embodiment, as the heat shrinking tube 54, a tube is used, which has an inner diameter substantially equal to the outer diameter of the terminal assembly 40 and has a heat shrinkage rate which is the same over the entire length, and only one end and the other end are heated and contracted. However, heat shrinking tubes 154, 254 illustrated in FIGS. 4A, 4B, 5A and 5B may be used.

Figure 4A:
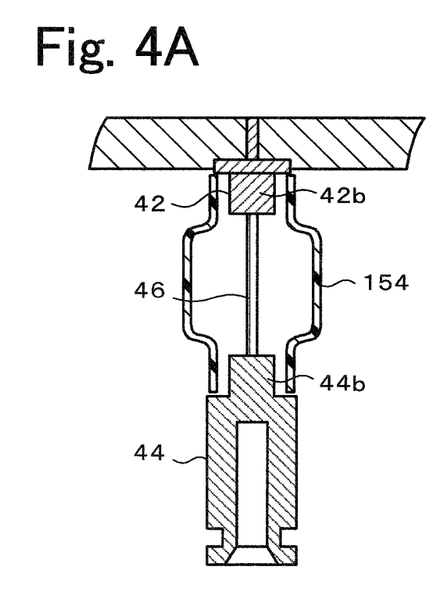
FIGS. 4A and 4B are assembly process views when a heat shrinking tube 154 is used.
Figure 4B:
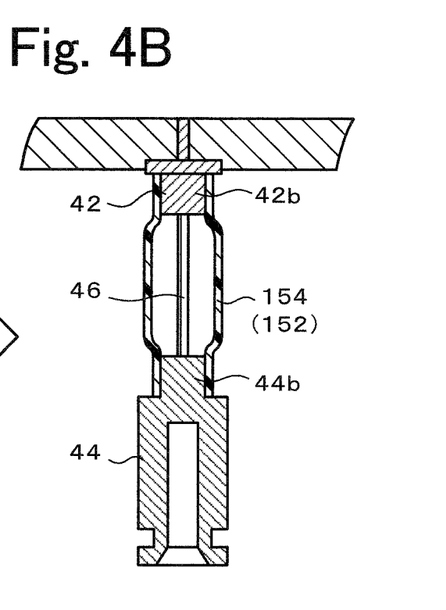

The heat shrinking tube 154 of FIGS. 4A and 4B has the same shrinkage rate over the entire length, but has an inner diameter of the central portion, larger than the inner diameter of both ends. As illustrated in FIG. 4A, the heat shrinking tube 154 is covered on the cable 46 of the terminal assembly 40. Specifically, the heat shrinking tube 154 is arranged so that one end of the heat shrinking tube 154 covers the projection 42b of the electrode terminal 42, the other end covers the projection 44b of the chuck side terminal 44, and the central portion covers the cable 46. In this state, the heat shrinking tube 154 is heated in its entirety. The heating may be performed using a heat gun or putting in a constant temperature reservoir. After the heating, as illustrated in FIG. 4B, the one end and the other end of the heat shrinking tube 154 are fixed to the projections 42b, 44b, and since the central portion originally has a large inner diameter, which is larger than the inner diameter of the one end and the other end. The heat shrinking tube 154 after heating becomes an insulating tube 152, and even after the heating, can deflect in the axial direction. Thus, the assembly process hereinafter for the semiconductor manufacturing apparatus 10 can be performed in the same manner as in the above-described embodiment.

Figure 5A:
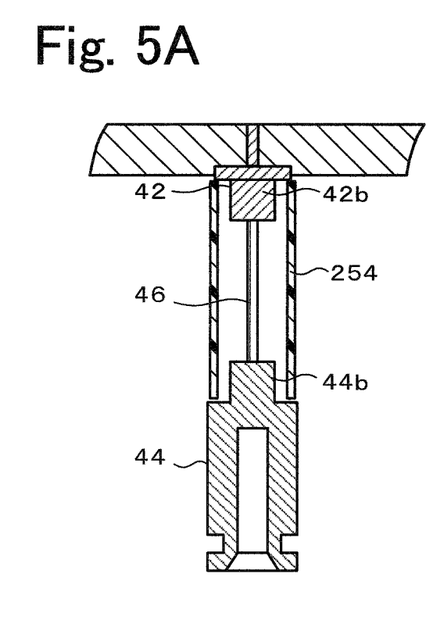
FIGS. 5A and 5B are assembly process views when a heat shrinking tube 254 is used.
Figure 5B:
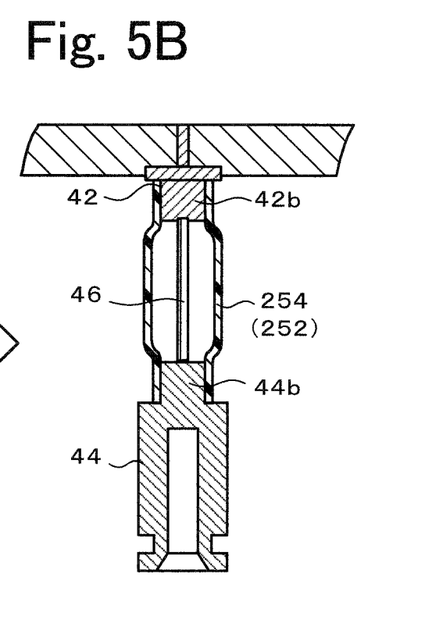

In the heat shrinking tube 254 of FIGS. 5A and 5B, the inner diameter is the same (substantially the same as the outer diameter of the chuck side terminal 44) over the entire length, and the heat shrinkage rate at the one and the other end is higher than the heat shrinkage rate at the central portion. The heat shrinking tube 254 is covered on the cable 46 of the terminal assembly 40 as illustrated in FIG. 5A. Specifically, the heat shrinking tube 254 is arranged so that one end of the heat shrinking tube 254 covers the projection 42b of the electrode terminal 42, the other end covers the projection 44b of the chuck side terminal 44, and the central portion covers the cable 46. In this state, the heat shrinking tube 254 is heated in its entirety. The heating may be performed using a heat gun or putting in a constant temperature reservoir. After the heating, as illustrated in FIG. 5B, the one end and the other end of the heat shrinking tube 254 are fixed to the projections 42b, 44b due to a higher heat shrinkage rate, but the central portion has an inner diameter larger than that of the one end and the other end due to a lower heat shrinkage rate. The heat shrinking tube 254 after heating becomes a heated insulating tube 252, and even after the heating, can deflect in the axial direction. Thus, the assembly process hereinafter for the semiconductor manufacturing apparatus 10 can be performed in the same manner as in the above-described embodiment.

In the above-described embodiment, the central portion of the insulating tube 52 may be bellows (snake belly). In this manner, the bellows portion of the insulating tube 52 is easily expanded or contracted in the axial direction, thus the insulating sleeve can be more easily pushed in the process from FIG. 3E to FIG. 3F. In this case, the insulating tube 52 is guaranteed to have an expansion and contraction property due to the structure of bellows, thus an expansion and contraction property of the material itself is not required.

Figure 6:
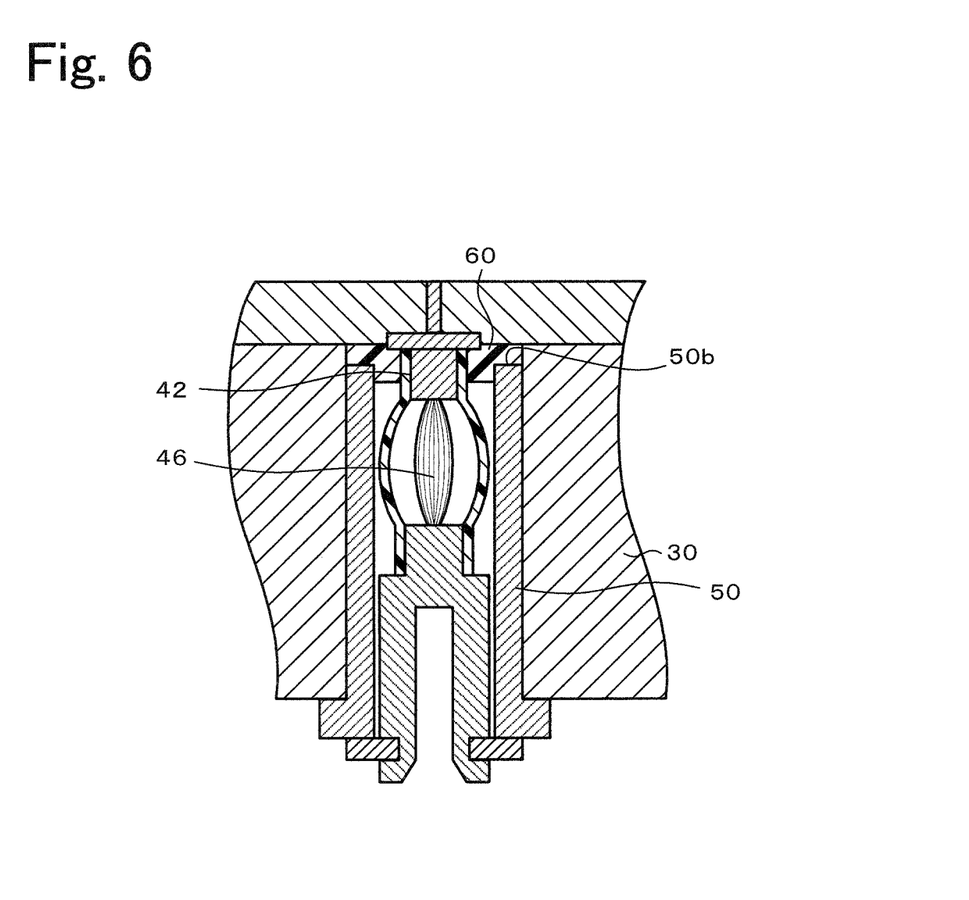
FIG. 6 is a partially enlarged cross-sectional view when a leading end 50b of an insulating sleeve 50 reaches an insulating resin member 60.

In the above-described embodiment, the leading end 50b of the insulating tube 50 may reach the insulating resin member 60 as illustrated in FIG. 6. In this manner, it is possible to further increase the withstand voltage across the base member 30 and the electrode terminal 42 and across the base member 30 and the cable 46.

The present application claims priority to Japanese Patent Application No. 2018-55519, filed on Mar. 23, 2018, the entire contents of which are incorporated herein by reference.

What is claimed is:

1. A semiconductor manufacturing apparatus comprising:
    a ceramic substrate which has a wafer mounting surface, and in which an electrode is built;
    a metal base member fixed to a surface, on an opposite side of the wafer mounting surface, of the ceramic substrate;
    an electrode terminal provided in the surface, on the opposite side of the wafer mounting surface, of the ceramic substrate and connected to the electrode;
    a through hole provided at a position of the base member, the position being opposed to the electrode terminal;
    an insulating sleeve fixed to an inner circumferential surface of the through hole;
    a semiconductor manufacturing apparatus-side terminal which is connected to the electrode terminal via a flexible cable, fixed to the insulating sleeve with arranged in the insulating sleeve, and detachably connected to a terminal of another apparatus;
    a flexible insulating tube that covers the cable, the flexible insulating tube having one end fixed to the electrode terminal and the other end fixed to the semiconductor manufacturing apparatus-side terminal; and
    an insulating resin member that covers at least part of the electrode terminal, the part being not covered by the insulating tube.

2. The semiconductor manufacturing apparatus according to claim 1,
    wherein an inner diameter of the insulating tube is greater than an outer diameter of the cable.

3. The semiconductor manufacturing apparatus according to claim 1,
    wherein the insulating tube has a deflection and bulge shape at a central portion which covers the cable.

4. The semiconductor manufacturing apparatus according to claim 1,
    wherein a leading end of the insulating sleeve does not reach the insulating resin member.

5. The semiconductor manufacturing apparatus according to claim 1,
    wherein the insulating tube is a heat shrinking tube.

6. The semiconductor manufacturing apparatus according to claim 1,
    wherein the insulating tube is formed of a material which is expandable and contractible in an axial direction of the through hole or formed in a structure which is expandable and contractible in the axial direction of the through hole.

7. The semiconductor manufacturing apparatus according to claim 1,
    wherein the cable is a twisted wire made of metal.

* * * * *